United States Patent [19]

Wanta

[11] Patent Number: 4,880,309

[45] Date of Patent: Nov. 14, 1989

[54] DARK FIELD TARGET DESIGN SYSTEM FOR ALIGNMENT OF SEMICONDUCTOR WAFERS

[75] Inventor: Mark S. Wanta, N. Richland Hills, Tex.

[73] Assignee: General Signal Corporation, Stamford, Conn.

[21] Appl. No.: 38,359

[22] Filed: Apr. 14, 1987

[51] Int. Cl.[4] ............................................. G03B 27/42
[52] U.S. Cl. ................................................... 356/401
[58] Field of Search .................... 355/59; 356/400, 401

[56] References Cited

U.S. PATENT DOCUMENTS 3,903,363 9/1975 Montone et al. ..................... 358/101
4,386,849 6/1983 Häeusler et al. ..................... 356/401
4,639,142 1/1987 Chow et al. ........................ 356/370
4,657,379 4/1987 Suwa ................................. 355/54
4,662,754 5/1987 Mayer ............................... 356/401

OTHER PUBLICATIONS

*Ultra Step 100 Wide Field Product Description Guide,* Ultratech Stepper.

Primary Examiner—Richard A. Rosenberger
Attorney, Agent, or Firm—Flehr, Hohbach, Test, Albritton & Herbert

[57] ABSTRACT

A dark field target design system for alignment of semiconductor wafers is disclosed. The system utilizes improved target designs which provide for improvement in the alignment of semiconductor wafers.

4 Claims, 19 Drawing Sheets

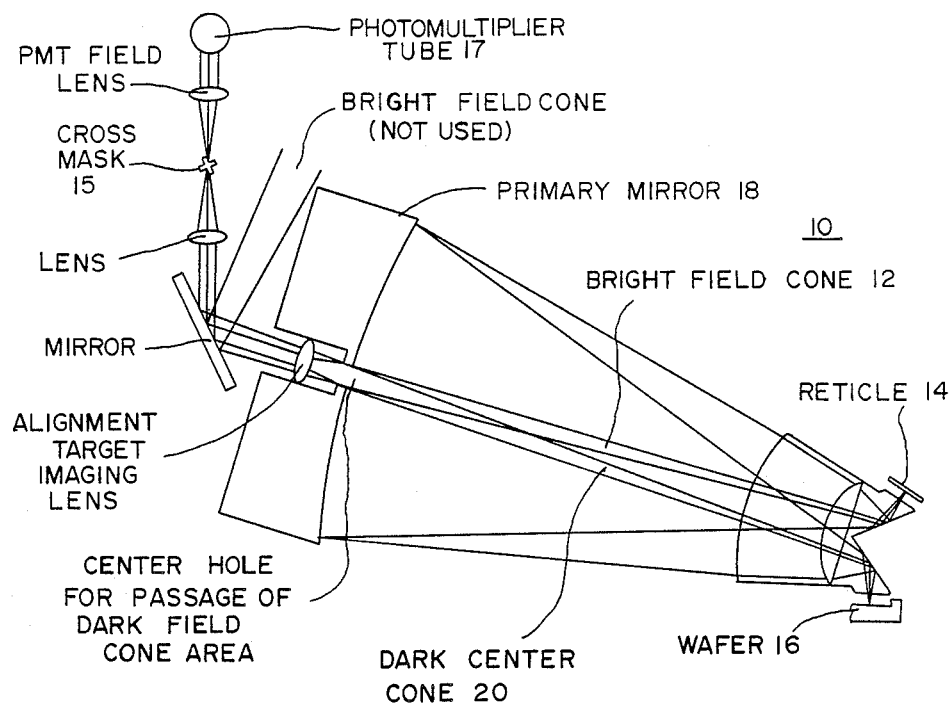
FIG.—1
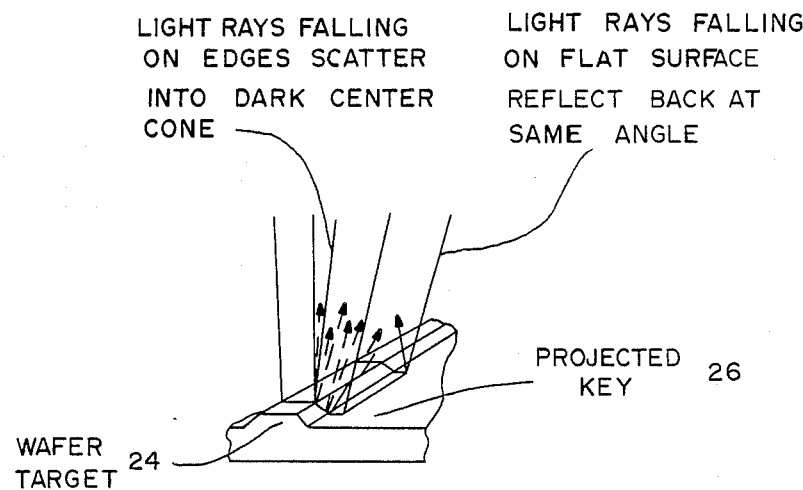
FIG.—2

SIGNAL TRACE FROM
PHOTOMULTIPLIER AS "TARGET"
IS SCANNED THROUGH PROJECTED "KEY"
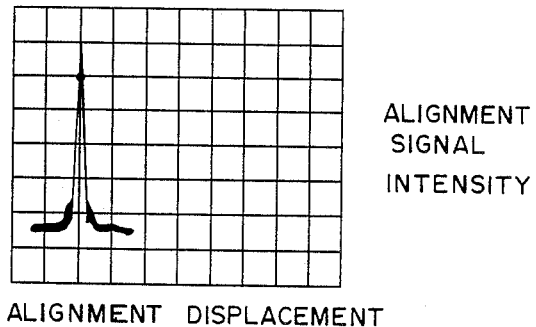
ALIGNMENT SIGNAL INTENSITY
ALIGNMENT DISPLACEMENT
FIG.—3
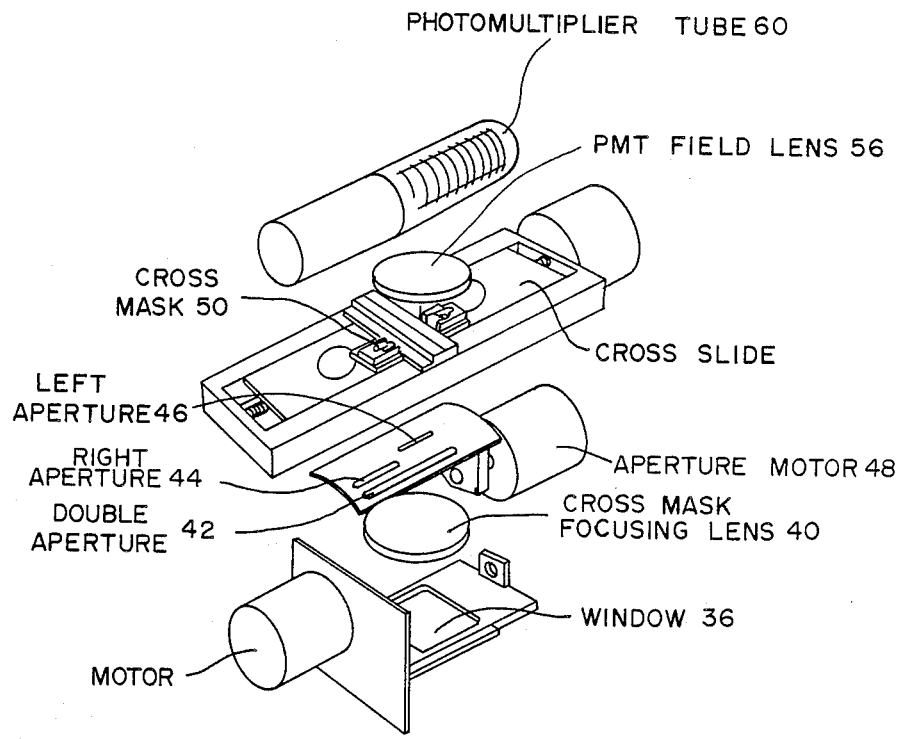
FIG.—4

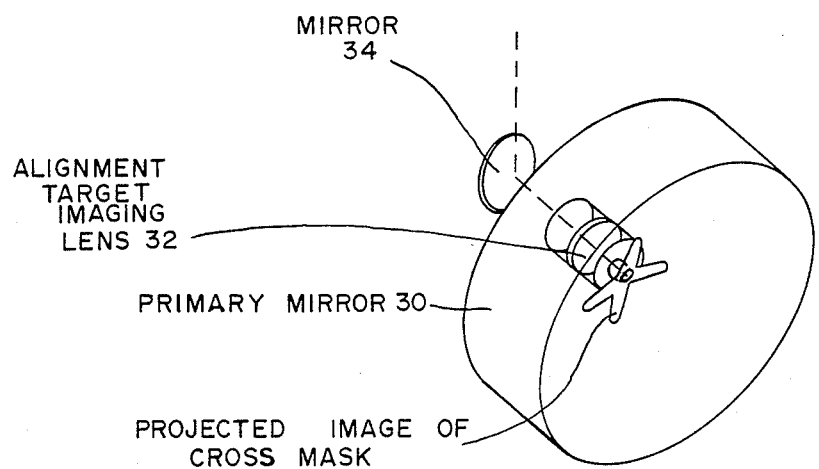
FIG.—5
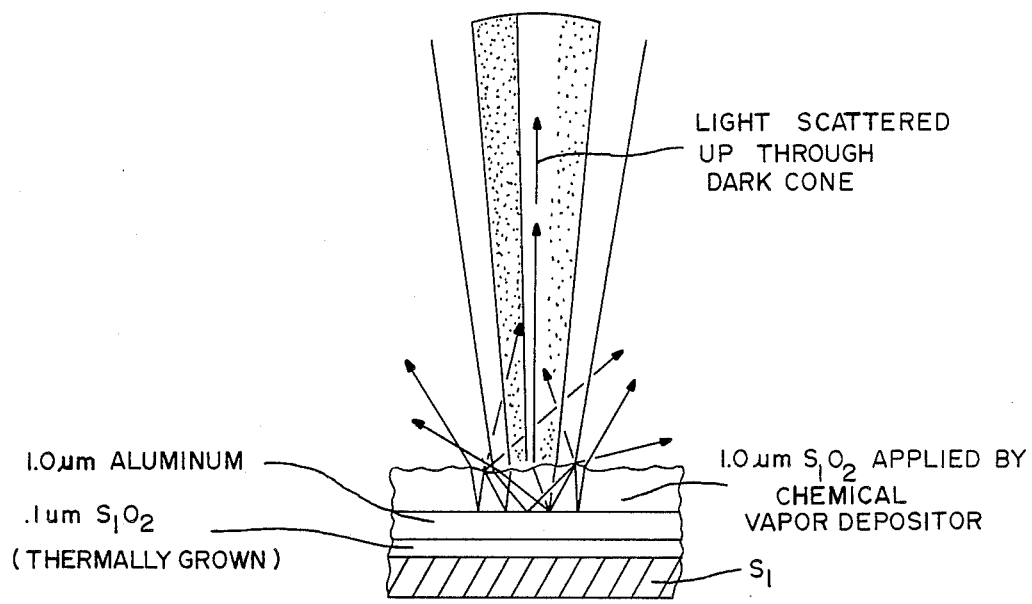
FIG.—6

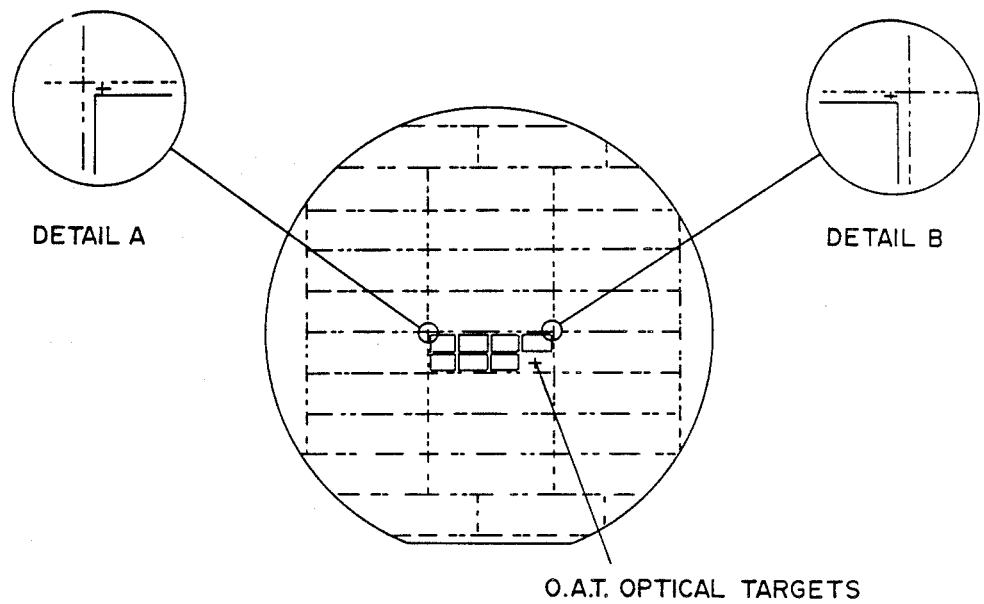
DETAIL A  DETAIL B
O.A.T. OPTICAL TARGETS
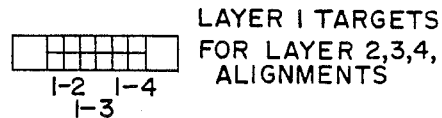
LAYER 1 TARGETS FOR LAYER 2,3,4, ALIGNMENTS
LAYER 2 KEY FOR ALIGNMENT WITH LAYER 1 TARGET
LAYER 3 KEY FOR ALIGNMENT WITH LAYER 1 TARGET
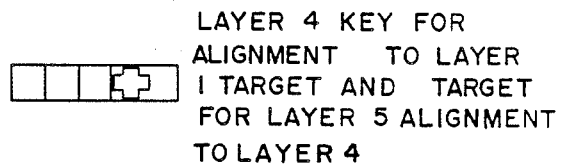
LAYER 4 KEY FOR ALIGNMENT TO LAYER 1 TARGET AND TARGET FOR LAYER 5 ALIGNMENT TO LAYER 4
LAYER 5 KEY FOR ALIGNMENT TO LAYER 4 TARGET
FIG.—8

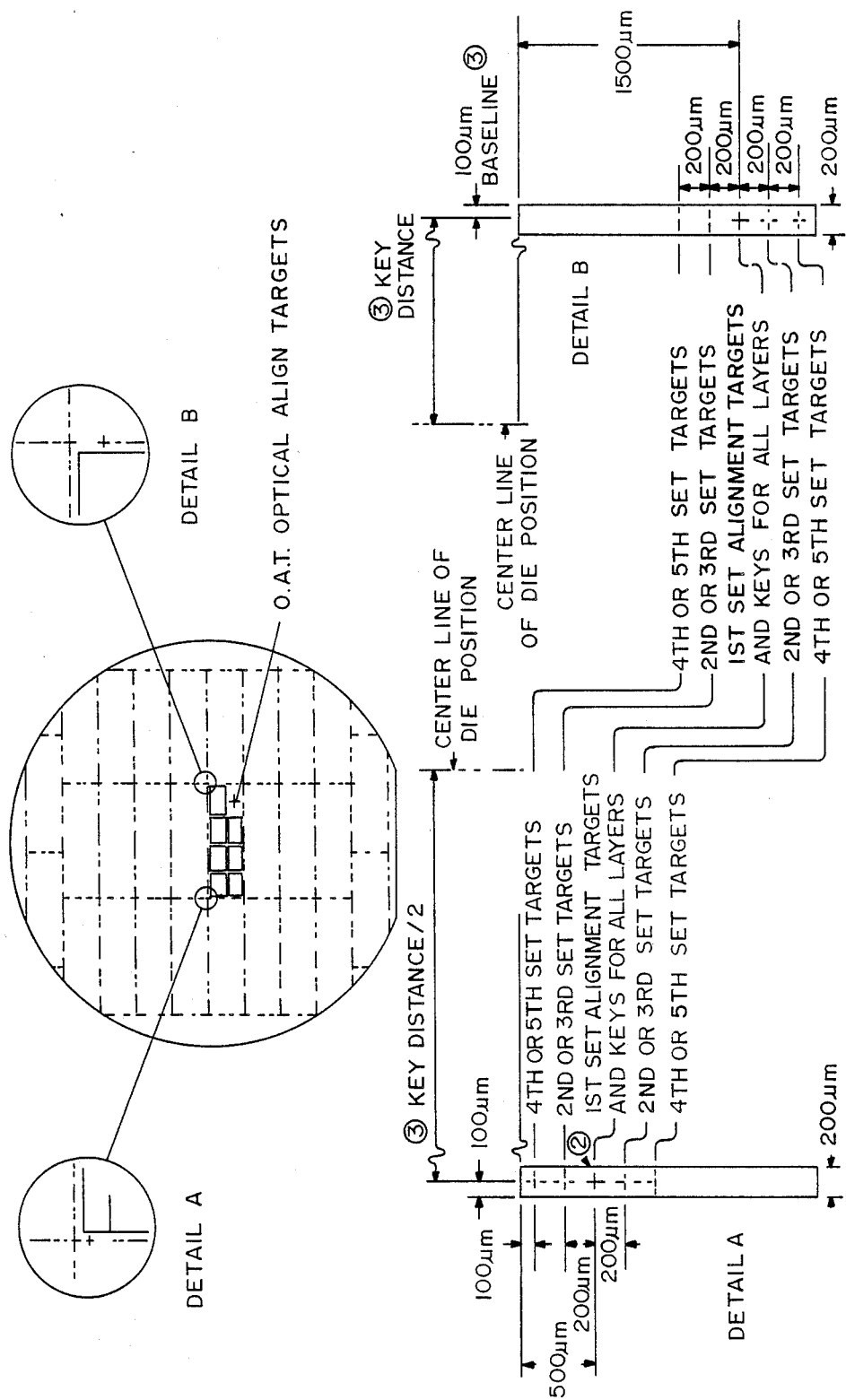
FIG.—9

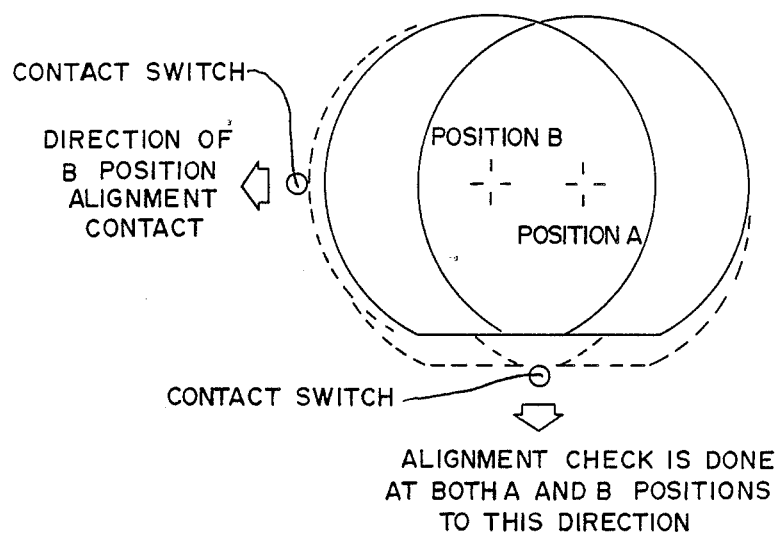
FIG.—7
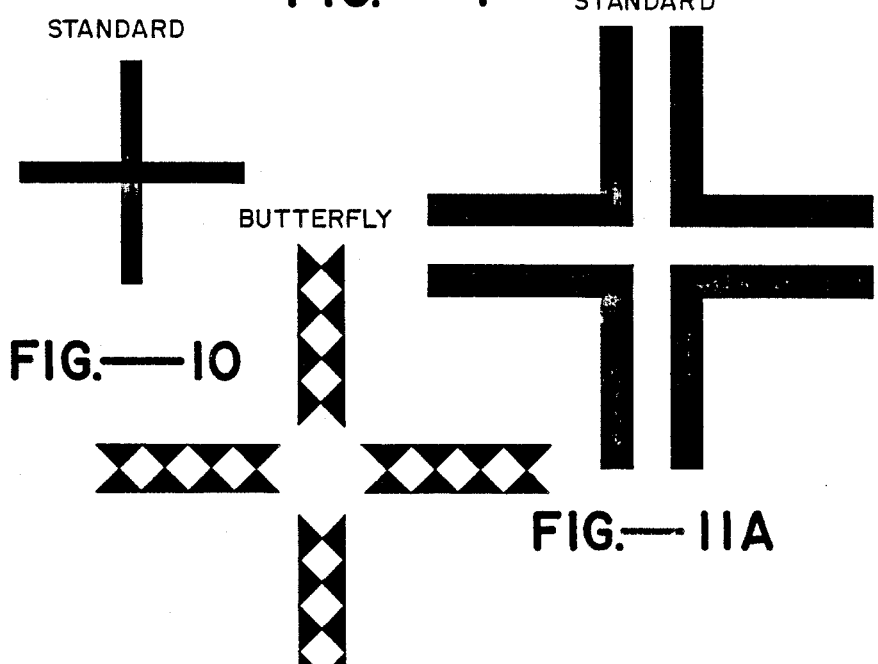
STANDARD
FIG.—10
BUTTERFLY
FIG.—11B
DOUBLE STANDARD
FIG.—11A

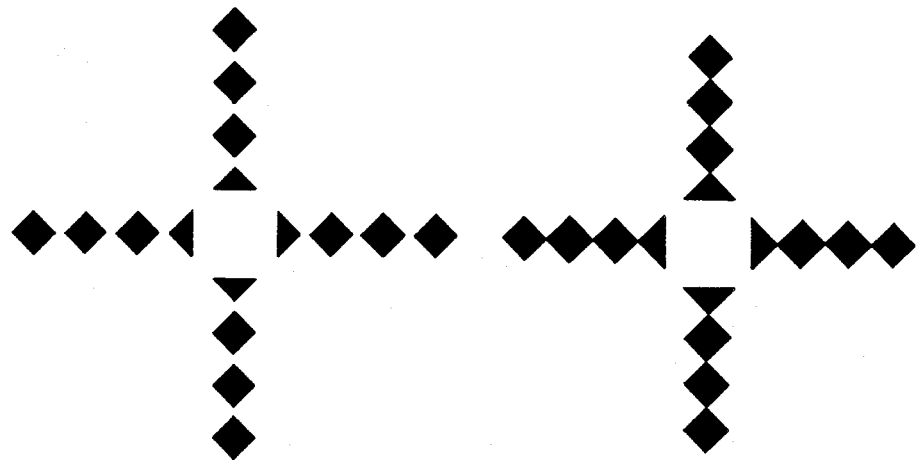
SPACED DIAMONDS
CONNECTED DIAMONDS
FIG.—11C  FIG.—11D
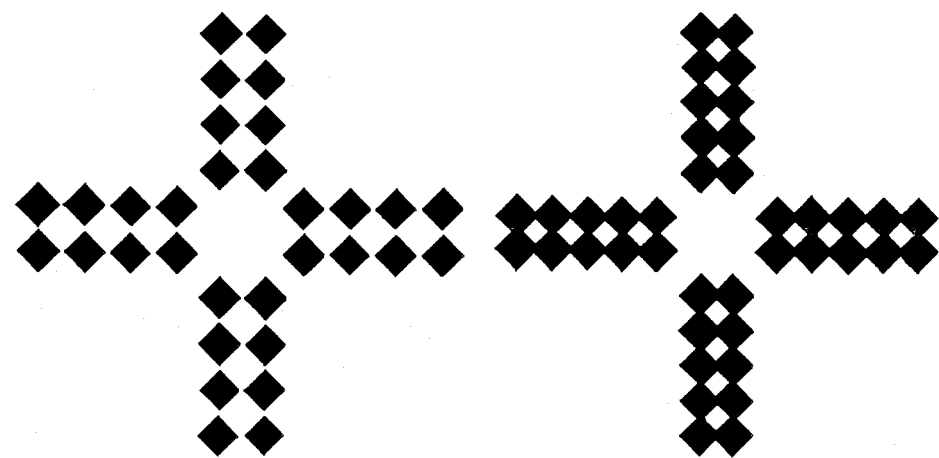
DOUBLE DIAMONDS
OVERLAPPING DOUBLE DIAMONDS
FIG.—11E  FIG.—11F DIAMOND WITHIN DIAMOND
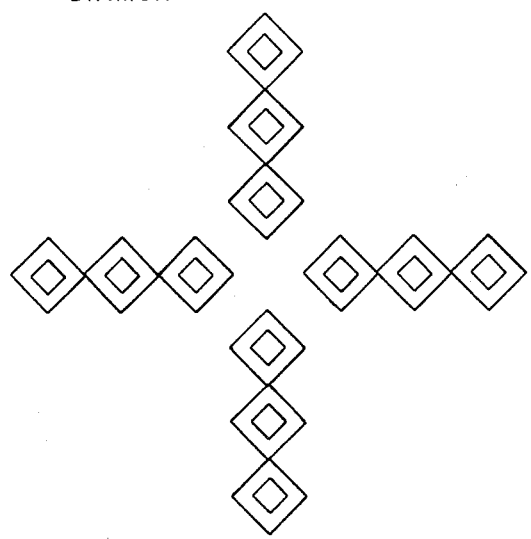
FIG.—11G
VERTICAL QUADS
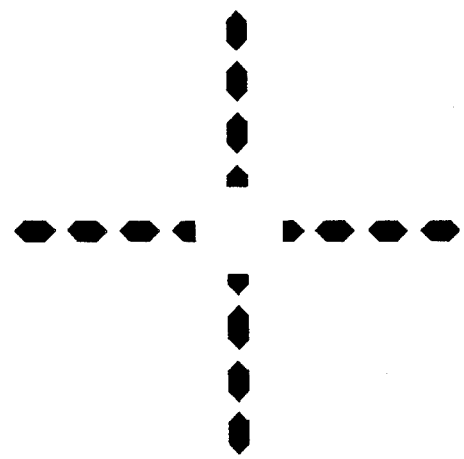
FIG.—11H
HORIZONTAL QUAD
TRIANGLES
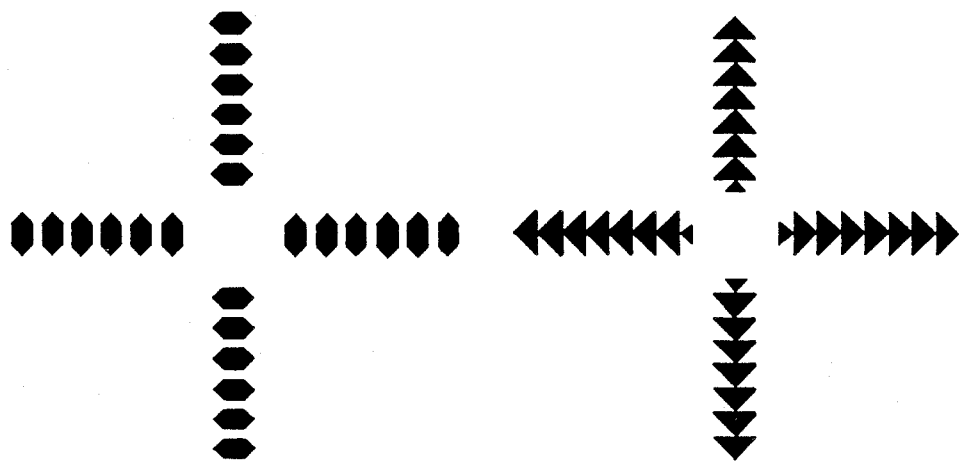
FIG.—11I
FIG.—11J SPACED TRIANGLES
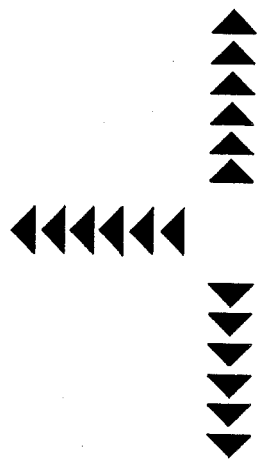
FIG.—11K
DOUBLE TRIANGLES
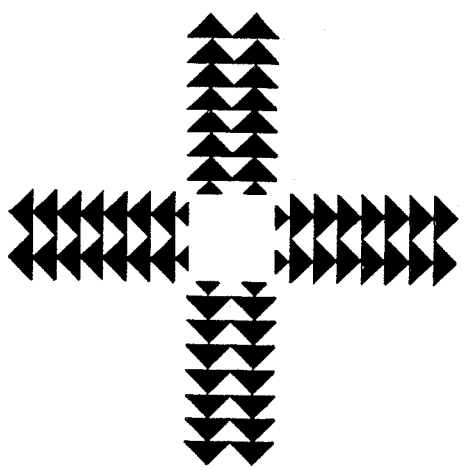
FIG.—11L
OVERLAPPING DOUBLE TRANGLES
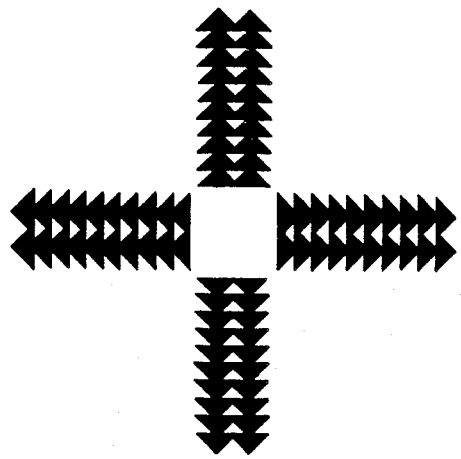
FIG.—11M
DOUBLE SQUARES
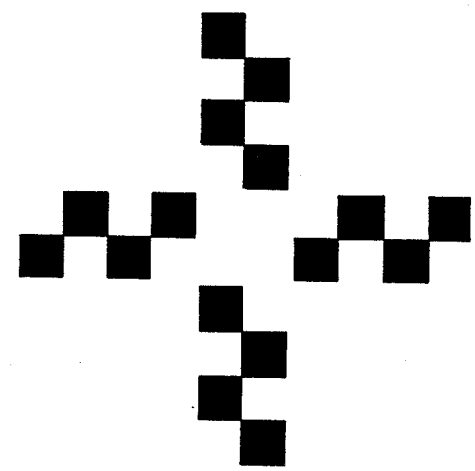
FIG.—11N

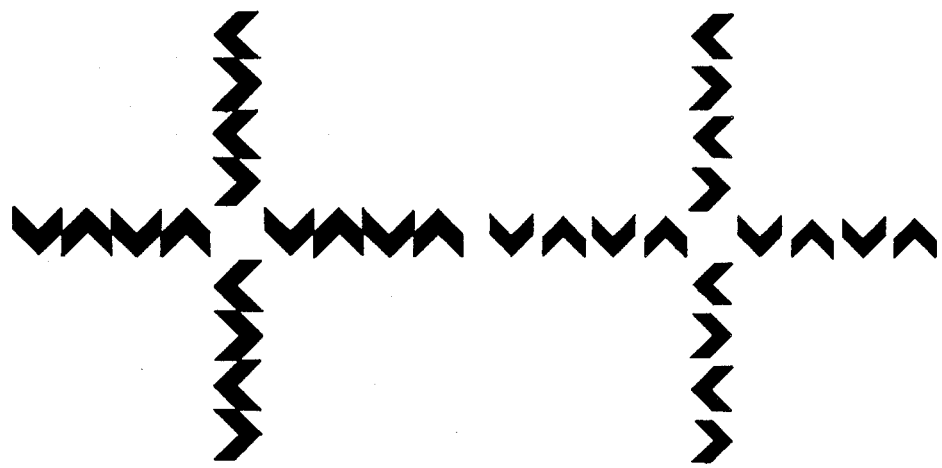
FIG.—11 O  FIG.—11 P
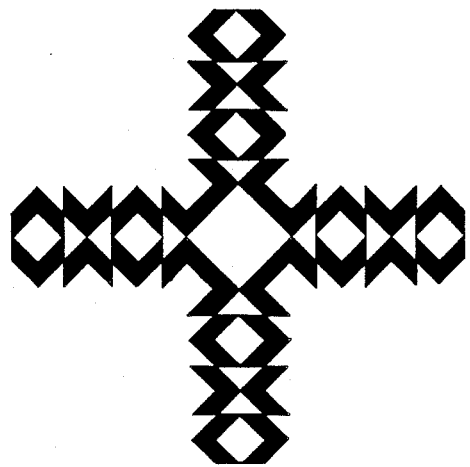
FIG.—11 Q

DARK FIELD TARGET DESIGN SYSTEM FOR ALIGNMENT OF SEMICONDUCTOR WAFERS

BACKGROUND OF THE INVENTION

The present invention relates to a wafer alignment system, and more particularly to a dark field target design system for alignment of semiconductor wafers.

Producing semiconductors requires 10 to 12 layers to be placed on top of each other. The quality of the alignment between each of these layers has a direct effect on circuit yield, the size of the device that can be built and speed of the circuit (performance). Finding an alignment target that is less affected by the semiconductor manufacturing processes, and day to day variations in the process, would directly or indirectly improve all of the above mentioned factors.

The use of dark field alignment systems are the most used automatic field by field alignment systems in the semiconductor industry. These new dark field designs provide the user with more consistent alignment, better alignment than is possible using the current target. Alignment signals will be much less affected by slight process variations while improving overall alignment and productivity.

SUMMARY OF THE INVENTION

It is an object of the present invention to provide an improved wafer alignment system.

It is a more particular object to provide a dark field target design system for alignment of semiconductor wafers.

Briefly, the present invention is directed toward a wafer alignment system which includes means for exposing a plurality of reticle images in a step and repeat manner onto a semiconductor wafer, and means for aligning each reticle image to targets in the wafer scribe area, and wherein said means for aligning include alignment target marks, each having a generally cross-shaped configuration yet having larger or longer edge length than normal or standard cross-shaped marks.

In one preferred embodiment, the arrangement of the means for aligning could be, utilizing a diamond-shaped configuration where each of the "arms" is in the form of interconnecting diamonds. In another embodiment, the means for aligning could be in the form of equilateral triangles placed next to one another along the width and length of the target itself. The length of the sides could be changed as the process or needs dictate.

Other objects, features and advantages of the present invention will become apparent from the following detailed description when taken in conjunction with the accompanying drawings.

BRIEF DESCRIPTION OF THE DRAWINGS

FIG. 1 depicts a diagram of a dark field alignment system.

FIG. 2 depicts a detailed diagram light rays as utilized in the system of FIG. 1.

FIG. 3 depicts a signal trace of the system of FIG. 1.

FIG. 4 depicts a general diagram of a projection system.

FIG. 5 depicts a diagram of a photomultiplier stage as utilized in the diagram of FIG. 4.

FIG. 6 depicts a "frosty" wafer.

FIG. 7 depicts a diagram of a mechanical alignment.

FIGS. 8 and 9 depict variations of optical alignment targets.

FIG. 10 depicts an existing alignment target.

FIGS. 11A-11Q depict improved alignment targets according to the present invention.

DETAILED DESCRIPTION OF THE DRAWINGS

As described above, the present invention is related to a wafer alignment system, and more particularly a dark field target design system for alignment of semiconductor wafers.

Alignment systems for semiconductor wafers are known in the art, such as in a system manufactured by Ultratech Stepper of Santa Clara, California, which performs accurate wafer and reticle alignment using a dark field alignment system, a photomultiplier stage, a wafer autoloader and X, Y and theta stages.

A general overview of such a system will briefly be described before going into more detail into the aspects of the present invention.

FIG. 1 depicts a schematic representation of a dark field alignment system 10 used in prior art systems, such as that made by Ultratech Stepper, as identified above.

In FIG. 1, a cone of light 12 coming from an image point on the reticle 14 is reflected down to form an image point on the wafer 16, minus a small center cone. A small hole in the center of the primary mirror 18 creates this dark field. Light rays, forming an image on the wafer surface, are reflected back at the same angle, and very little light is reflected back up the dark center cone 20.

When a wafer target 24 is moved into the projected image of the reticle key 26, light is scattered in all directions from the edge of the target 24, as depicted in FIG. 2. Some of this light travels up the dark center cone and is re-imaged at the cross masks 15 of FIG. 1. The cross masks "mask" light from all features except the proper key/target combination. The Photomultiplier Tube (PMT) 17 senses the intensity of that light and returns a signal voltage as the wafer target 24 is scanned through the reticle key image. This signal is amplified and displayed on a target alignment monitor, as depicted in FIG. 3. A peak detector enables a voltage divider circuit to select a point along the scan after the peak. This point corresponds to an alignment target edge. A computer then records an instantaneous position sample from the laser-controlled stage. A scan in the opposite direction results in a second position sample, canceling any phase (time delay) errors. The average of the two samples is the target position, repeatable to ±0.14 micron (2 sigma).

The PMT stage depicted in FIG. 5 (which forms a portion of the system of FIG. 4, which is known in the art) contains the necessary optical and mechanical components to allow the system to adjust to different size image fields and small reticle assembly variations.

In FIG. 5, starting at the primary mirror 39, the light that an alignment target scatters into the dark central cone passes through the same hole that formed the dark cone. The light beam is focused by an achromat lens 32 and reflected up toward the PMT stage from a mirror 34.

The beam passes through a tilt window 36 which refractively shifts the image in the Y direction. The beam then passes off-center through a plano-convex lens 40.

Before reaching the cross masks 50, the beam passes through one of three apertures 42, 44, 46 on an motor-operated shutter 48. The shutter may select right or left apertures ("eyes") to alternatively view right or left reticle alignment fiducials or right or left reticle image alignment marks for theta alignment. The shutter 15 may also select a larger aperture to view both marks at once. The net effect of this is to split the run-out alignment error when aligning wafers.

The image is focused at the cross masks 50, whose purpose is to spatially mask out all light in the dark cone except that small area around an alignment mark. The cross masks 50 are mounted in cross sliders guided by a straight-edge (not shown) and moved equal distances apart by a reverse-threaded lead screw driven by a stepper motor. The computer uses reticle data to select the correct cross mask separation for a given set of image alignment marks.

Beyond the cross masks 50, a lens 56 focuses the rays on the photo cathode in the PMT 60. The PMT 60 converts light beam intensity to an electrical signal. The signal is amplified and sent to a photoboard where it is modified and displayed on the target alignment monitor. As previously described, by means of a peak detection circuit and a voltage divider, the photoboard selects a sample point.

As an optical image is scanned, the peak is detected, the signal drops to the sample point, a pulse is sent to X and Y comparator boards, and the computer records a position sample from the laser-controlled stage. Scanning in both directions cancels phase (time delay) errors so the computer can take the sample average as the position of an alignment feature. If inspection of the final results indicates a consistent offset, the user may enter the offset into the computer.

During reticle alignment, a "frosty" wafer is used to scatter the light from the image of the reticle alignment I0 fiducial back into the dark center cone. The "frosty" wafer is loaded into the system for reticle alignment, then removed when alignment is complete.

As depicted in FIG. 6, the "frosty" wafer consists of a blank wafer with a 0.1 micron layer of thermally grown silicon dioxide for thermal coefficient compensation, followed by a one-micron layer of evaporated aluminum to provide a mirror, topped by a one-micron layer of unflowed silicon dioxide, applied by chemical vapor deposition to provide light scattering. The effect is similar to a beaded movie screen, except that the grain size of the top layer is smaller than the projected alignment mark image. This contributes to a smooth signal at the PMT of FIG. 5; a smooth signal is necessary because the wafer is scanned under the projected image as the reticle is moved along the reticle stage.

Using the 1 mm reticle fiducials with the PMT stage, the reticle is aligned to the system with a precision of ±2 microns. The computer compensates for slight reticle mounting variations after reticle alignment. Reticle alignment is accomplished by moving the reticle in X to locate the vertical component of the left reticle alignment fiducial through the left "eye" (left aperture and left cross mask) of the PMT stage. When the reticle alignment fiducial passes beneath the left "eye," the PMT detects a peak signal and the computer samples the reticle's position in X. This process is repeated several times for accuracy and results in the registration of the reticle in the X axis of the system.

Using the PMT tilt window, the reticle image is optically moved along the Y axis to locate the horizontal component of the left reticle alignment fiducial. When the PMT detects a peak signal, the computer records the position of the PMT tilt window. Next, the right reticle alignment fiducial is positioned into the PMT's field of view (right eye) and is scanned in Y to measure any reticle skew. The acceptable reticle skew tolerance is 0.75 milliradian.

Since the reticle is not mechanically adjustable in Y or theta, each wafer is aligned to the orientation of the reticle rather than to the X and Y axes of the stepper system.

Wafer alignment proceeds through several steps which vary depending upon the selected run mode. After coarse wafer flat-finding is performed at the loader, Mechanical Alignment (Run Mode #1) may be performed. It consists of wafer positioning and wafer edge sensing on the chuck for blind stepping the first layer, as depicted in FIG. 7.

If alignment to a previous image is required, Align and Expose (Run Mode #2) is used. The first function performed is Optical (Global) Alignment. This function consists of automatic global capture of an Optical Align Target (OAT) (FIGS. 8 and 9). This results in coarse X, Y and theta adjustment.

The next function, "Prealign," is performed at a centrally located stepping position. At this step, theta is adjusted to achieve a right to left $\Delta Y$ of less than 0.1 $\mu$m.

Upon completion of Prealign, The Step-Align-Settle-Exposure sequence is performed. This process aligns the existing exposure layer to the reticle field image and exposes.

Mechanical Alignment:

When exposing the first layer, mechanical align is used for global referencing. To perform a mechanical alignment, the stage moves the wafer under the air probes. The chuck rises to the top limit in Position A (FIG. 7). The wafer is held in this position and the edge switches drop down to the level of the wafer. The wafer is then brought forward to touch the front edge switch at the left side of the flat. After contact between the wafer and edge switch, the stage is backed away and the computer records a position sample. The wafer is moved a known distance to Position B, brought forward, then backed away again to record a second position sample. The computer performs calculations to globally reference the wafer in Y and theta for blind stepping the first exposure layer. The computer then commands a theta correction. If the required correction is more than a given amount, the process is repeated one more time to insure accuracy. Next, the wafer touches the left edge switch twice (only once for a 6-inch wafer) to record an X position sample and to determine if a minor wafer flat exists. Thus, in approximately eight seconds, the center of the wafer is referenced to the stage to within ±10 microns in X and Y and within ±1 milliradian in theta.

Optical (Global) Alignment:

Since a die pattern may not be reliably located from the left and bottom edges of the wafer in mix-and-match production, one or more Optical Alignment Targets (OAT) larger than the expected variation are placed on the wafer (FIGS. 8 and 9). Using a reticle key, the stepper scans three legs of the OAT for X-Y alignment which provides position samples for coarse theta adjustment as well.

Prealign (Fine Theta Adjustment):

Upon completion of Optical Alignment, the stage steps to the primary prealign position for Prealign or fine theta alignment. The machine first scans the left wafer target underneath the left reticle key through the left aperture ("eye"). Then it scans the left wafer target underneath the right key through the right aperture ("eye"). Theta correction is made, and the left and right targets are scanned again. This process is repeated until the detected error is less than 0.1 micron.

Site-by-Site Alignment:

Once theta alignment is within tolerance, the machine begins to step, align at each step in X and Y, and expose images. Further theta alignment is normally not required. A serpentine stepping pattern is continued until the wafer is completely exposed.

Alignment marks on the wafer are referred to as targets; those on the reticle are termed keys and are always clear crosses in a chrome field. The reticle may also contain alignment marks for subsequent layer targets. These targets may be clear or dark, depending on the desired wafer target topography. Keys and targets are typically placed in the scribe streets and require a 200-micron-square area free from other geometries.

Alignment marks are located in either the horizontal (HAMS-Horizontal Alignment Marks, FIG. 8), or vertical (VAMs-Vertical Alignment Marks, FIG. 9) scribe streets. The placement, whether vertical or horizontal, must be consistent for a given reticle set. A slightly different machine configuration (PMT set up) is required for vertical and horizontal alignment.

In order to align an existing exposure layer to a reticle field image when using VAMs, wafer targets are moved under the reticle keys and then offset for exposure. This allows targets to be reused throughout the process, and also allows other targets to be printed for subsequent layers.

When HAMs are used, the keys and targets are in the same position. Since no offset of HAMs occurs, the same targets are not reused. Whenever etching steps follow masking steps, new targets must be used for future alignment.

If an intermix is planned, the reticles/masks used on the other machines must contain properly designed and placed targets, including at least one Optical Alignment Target.

The present invention utilizes different and improved dark field target designs depicted in FIGS. 11A-11Q against the standard "cross" design, which is depicted in FIG. 10.

The improved target configurations are depicted in FIGS. 11A-11Q, which show variation from the standard cross-configuration utilized in presently existing systems.

The variations of preferred embodiments, according to the present invention, as depicted in FIGS. 11A-11Q, can be identified at follows:

FIG. 11A is a double standard cross configuration.
FIG. 11B depicts a butterfly configuration.
FIG. 11C depicts a space diamond configuration.
FIG. 11D depicts a connected diamond configuration.
FIG. 11E depicts a double diamond configuration.
FIG. 11F depicts an overlapping double diamond configuration.
FIG. 11G depicts a diamond within a diamond configuration.
FIG. 11H depicts a vertical quad configuration.
FIG. 11I depicts a horizontal quad configuration.
FIG. 11J depicts a triangle configuration.
FIG. 11K depicts a spaced triangle configuration.
FIG. 11L depicts a double triangle configuration.
FIG. 11M depicts an overlapping double triangle configuration.
FIG. 11N depicts a double squares configuration.
FIG. 11O depicts a zig configuration.
FIG. 11P depicts a spaced zig configuration.
FIG. 11Q depicts a double zig configuration.

According to one aspect of the present invention, the improved target configurations provide a significant advantage over the prior art because of the larger edge o length as depicted in FIG. 11, yet still conforming to the same general size and shape as utilized by existing systems.

For example, as depicted in FIG. 11C, a diamond-type configuration is depicted therein which utilizes a series of diamond-shaped structures which can be connected, overlapped or spaced at any interval with, in general, the smallest interval providing the best results.

Also, as depicted in FIG. 11K, the use of equilateral triangles placed next to each other along the length and width of the target provide another improvement over the standard cross-type configuration. The length of the sides could be changed as the process or needs dictate. The width of the targets is desirably approximately five microns.

The improved designs of FIG. 11 reflect more light from the center of the target rather than the sides. This provides with improved signal and alignment and reduces the need to precisely determine the proper target size used for alignment.

Alignment signal improvement is seen because the improved target designs provide 25-30% more surface area over the same distance on the standard target. This improves the signal-to-noise ratio, making for more consistent alignment.

What is claimed is:

1. A dark field wafer alignment system comprising means for exposing a plurality of reticle images in a step and repeat manner onto a semiconductor wafer, and means for aligning each reticle image to targets in the wafer scribe area wherein said means for aligning include alignment marks having a generally cross-shaped configuration of arms wherein each arm o said configuration is in the shape of a series of separate zigged shaped target structures so as to provide a sufficient edge length and surface area to reflect more light from the center of the target rather than the sides thereof.

2. The system as in claim 1 wherein the width of said target is approximately 5 microns.

3. In a dark field wafer alignment system for exposing a plurality of reticle images in a step and repeat manner onto a semiconductor wafer, the apparatus comprising means for aligning each reticle image to targets in the wafer scribe area wherein said means for aligning include alignment marks having a generally cross-shaped configuration of arms wherein each arm of said configuration is in the shape of a series of zigged shaped separate target structures to provide a sufficient edge length and surface area to reflect more light from the center of the target rather than the sides thereof.

4. The system as in claim 3 wherein the width of said targets is approximately five microns.

* * * * *